United States Patent [19]

Langdon, Jr. et al.

[11] Patent Number: 4,467,317
[45] Date of Patent: Aug. 21, 1984

[54] HIGH-SPEED ARITHMETIC COMPRESSION CODING USING CONCURRENT VALUE UPDATING

[75] Inventors: Glen G. Langdon, Jr., San Jose; Jorma J. Rissanen, Los Gatos, both of Calif.

[73] Assignee: International Business Machines Corporation, Armonk, N.Y.

[21] Appl. No.: 281,734

[22] PCT Filed: Mar. 30, 1981

[86] PCT No.: PCT/US81/00400
§ 371 Date: Mar. 30, 1981
§ 102(e) Date: Mar. 30, 1981

[87] PCT Pub. No.: WO82/03514
PCT Pub. Date: Oct. 14, 1982

[51] Int. Cl.³ ............................................ H03K 13/00
[52] U.S. Cl. ............................. 340/347 DD; 235/310
[58] Field of Search ............... 340/347 DD; 235/310, 235/311

[56] References Cited
U.S. PATENT DOCUMENTS
4,286,256 8/1981 Langdon .................... 340/347 DD OTHER PUBLICATIONS
Rissanen, "IEEE Transactions on Information Theory", vol. IT-27, No. 1, Jan. 1981, pp. 12–23.
Rissanen, "IBM Journal of Research & Development", vol. 23, No. 2, Mar. 1979, pp. 149–162.
Langdon, "IBM Technical Disclosure Bulletin", vol. 23, No. 1, Jun. 1980, pp. 310–312.

Primary Examiner—C. D. Miller
Attorney, Agent, or Firm—R. Bruce Brodie

[57] ABSTRACT

A method and apparatus for recursively generating an arithmetically compressed binary number stream responsive to the binary string from conditional sources. Throughput is increased by reducing the number of operations required to encode each binary symbol so that only a single shift of k bits is required upon receipt of each least-probable symbol or an "add time", followed by a decision and a one-bit shift in response to each most-probable symbol encoding. The concurrent augmentation of the compressed stream and an internal variable involves only the function of a probability interval estimate of the most-probable symbol, and not upon the past encoding state of either variable ($2^{-k}$, 49, 63, C, T). Each binary symbol may be recovered by subtracting $2^{-k}$ from the q-most-significant bits of the compressed stream and testing the leading bit of the difference.

4 Claims, 3 Drawing Figures

HIGH-SPEED ARITHMETIC COMPRESSION CODING USING CONCURRENT VALUE UPDATING

DESCRIPTION

1. Technical Field

This invention relates to arithmetic compression coding of conditional binary sources, the coding being controlled by a parameter whose values correspond to predetermined source probability intervals.

2. Background Art

The prior art of FIFO arithmetic string encoding is detailed in the copending U.S. patent application Ser. No. 098,285, filed on Nov. 28, 1979. Further, methods for carry-over control in FIFO arithmetic code strings are set out in copending U.S. patent application Ser. No. 048,319, filed on June 14, 1979, and the IBM Technical Disclosure Bulletin, Vol. 23, pages 310–312, published in June 1980.

Rissanen and Langdon, "Arithmetic Coding", IBM Journal of Research and Development, Vol. 23, No. 2, March 1979, discloses that in arithmetic coding, the current code string is generated recursively by adding augends to the previous code string which result from the encoding of the previous binary source symbol. Decoding involves examining the most significant part of the code string and determining from its magnitude the largest augend not exceeding the numerical value of said code string. The augend is, in turn, subtracted out. The decoded symbol is that source alphabet symbol which corresponds to the subtracted-out augend.

Rissanen and Langdon, "Universal Modeling and Coding", IEEE, Trans. Information Theory, Vol. IT-27, No. 1, January 1981, partition the data compression problem in a modeling part and a coding part. The present invention deals only with the coding aspect of compression. The Rissanen and Langdon reference also depicts the code string generated by a FIFO arithmetic code as being a number in the interval (0,1), that is, a semi-open interval on the number line which includes 0, but does not include 1. The code is constrained in order to treat rational numbers along this interval. The source string is encoded recursively, one source symbol b at a time. Operatively, arithmetic coding successively subdivides this interval. A subinterval corresponding to a so-far encoded source string $s=b(1), b(2) \ldots b(i)$ is defined by its lower bound, $C(s)$, in the interval, and a number $T(s)$ defining the size of the interval. Significantly, the subinterval size is represented to a fixed precision in that the number of significant digits in the binary representation of $T(s)$ is no more than a predetermined q bits in length. The subinterval thus defined may be represented by $[C(s), C(s)+T(s)]$. The interval includes the lower-bound $C(s)$ and spans the range up to, but not including, the number $C(s)+T(s)$.

According to the prior art U.S. patent application Ser. No. 098,285, in order to encode the next symbol, the interval length $T(s)$ should be subdivided into as many parts as there are source symbol values. In the binary case, each source symbol takes only one of two symbol values. This requires that the interval be partitioned into two parts with two corresponding size values T. The values T are calculated according to an integer-valued control parameter k. Thus, the two sizes T resulting from the partitioning or subdivision operation are assigned to the more probable symbol (MPS) and the less probable symbol (LPS), respectively. For the subdivision operation disclosed in the prior art, specifically:

Size 1: $T(s) \times (1 - 2^{-k})$ (1a)

Size 2: $T(s) \times 2^{-k}$ (1b)

The new subinterval would be encoded as:

if next symbol MPS: $[C(s), C(s) + \text{size 1}]$ (2a)

if next symbol LPS: $[C(s) + \text{size 1}, C(s) + \text{size 2}]$ (2b)

In FIG. 2b, size 1 is called the augend because size 1 is added to $C(s)$ to form the new lower bound.

A stream of ones and zeros to be encoded can also be represented as a run of MPS's terminated by an LPS. The action of the encoder requires modification of the code string value $C(s)$ and the current subinterval magnitude $T(s)$. Let s.b denote the so-far encoded string following the recursive encoding of symbol b. The prior art states that:

For each MPS $C(s.MPS) = C(s)$ (3a)

$T(s.MPS) = T(s) \times (1 - 2^{-k})$ (3b)

For each LPS $C(s.LPS) = C(s) + T(s.MPS)$ (3c)

$T(s.LPS) = T(s) \times 2^{-k}$ (3d)

This means that,

Upon the occurrence of each LPS in a binary symbol string, the worst-case cycle time requires an encoder to perform four operations. These comprise the steps of (1) decreasing by shift and subtract an internal variable $T(s)$ as a function of the control parameter k in order to form $T(s.\text{MPS})$; (2) adding this variable to q of the least-significant bits of $C(s)$; and (3) left-shifting both by a predetermined amount.

Upon the occurrence of each MPS, the encoder (1) decreases the internal variable, as above; and (2) executes a normalizing left-shift of both $C(s)$ and $T(s)$ in the absense of a leading 1. Significantly, since the results T from a previous step (step 1) must be used in the next step, (step 2), there is no possibility of simultaneous updating using only current values.

THE INVENTION

The technical problem sought to be solved by this invention is that of increasing the throughput of a FIFO arithmetic encoder by increasing the concurrency of the operations in each encoding and decoding cycle. In this regard, the invention is premised on first inverting the order of the subinternal division of Eq. 2. Now the magnitude alteration of the compressed code stream $C(s)$ occurs for each MPS, instead of LPS. Secondly, a left-shifting of $C(s)$ a predetermined amount is conditioned by the occurrence of each LPS; instead of incrementing $C(s)$ by a function of the internal variable $T(s)$. The unnormalized internal variable becomes $2^{-k}$, which is normalized by merely a left-shift. Thirdly, concurrency is attained by updating both $C(s)$ and $T(s)$ as a function of the control parameter k independent of the previous value of T(s). As a consequence, the number of sequential operations required to encode one binary symbol is reduced to: either a single shift of k bits (LPS) or an "add" time, followed by a decision and a one-bit shift (MPS).

The advance may be seen to rest upon the unexpected observation that a function of a parameter whose values correspond to predetermined source alphabet probability intervals for each MPS could be used to concurrently augment both C(s) and T(s) because it was not a function of the past state of either. This is in contrast with the prior FIFO arithmetic coding art which required updating first T(s) and then C(s) upon the occurrence of each LPS.

The invention is then perceived as a method and apparatus for recursively generating an arithmetically compressed binary stream C(s.b) in high-to-low position magnitude order responsive to successive symbols b(i) from a binary symbol string $s=b(1), b(2) \ldots b(i), \ldots b(n)$. The steps include (1) writing the q-least-significant bits of C(s) and an internal variable T(s) into respective first and second registers; (2) for each b(i), ascertaining whether it constitutes an MPS and receiving an integer parameter approximation k for the expectation of an LPS being roughly $2^{-k}$; (3) if b(i) is an MPS, then concurrently incrementing the first register contents and decrementing the second register contents by $2^{-k}$ and left-shift normalizing both register contents if the second register contains a leading zero; and (4) if b(i) is LPS, then left-shifting the first register contents by k positions and setting the second register contents to unity.

BEST MODE AND INDUSTRIAL APPLICABILITY

Figure 1:
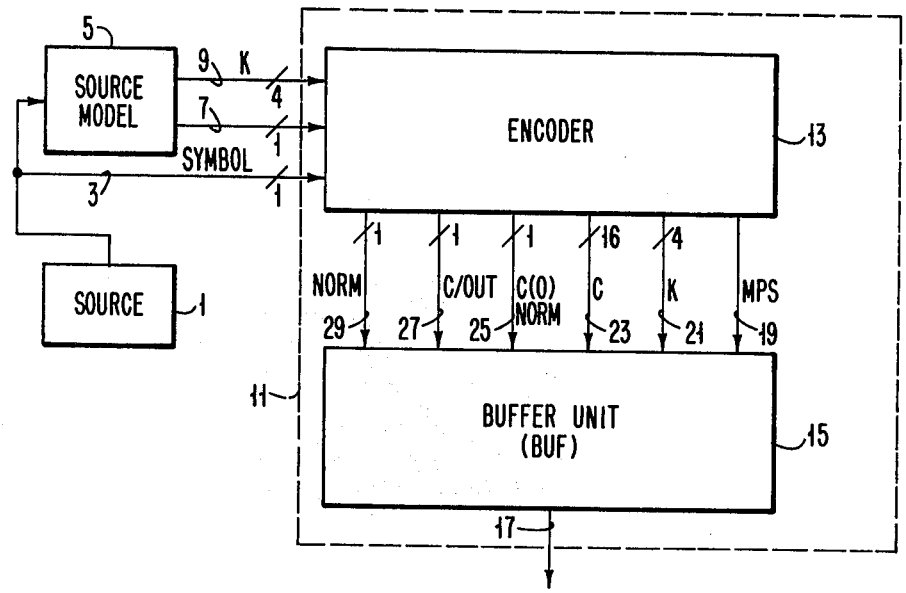
FIG. 1 is a block diagram showing the encoded interface to both a source and model.

The following recursions define the encoding action according to the invention, exclusive of normalization, which is discussed in a subsequent passage:

For each MPS $$C(s.MPS) = C(s) + 2^{-k} \quad (4a)$$

$$T(s.MPS) = T - 2^{-k} \quad (4b)$$

For each LPS $$C(s.LPS) = C(s) \quad (4c)$$

$$T(s.LPS) = 2^{-k} \quad (4d)$$

It is recognized that it is necessary to maintain the alignment of the significant bits of subinterval size T to the working end of C(s) in order to add the augend in the proper place. Following this addition, it is necessary to realign the working end of the code string C(s.b). The operations of renormalization and code string realignment require the following steps. If the symbol LPS is encoded, then the unnormalized size is $2^{-k}$ of the form 0.00 ... 0100. The number of leading zeros is "k". This means that the normalized internal variable $T(s.LPS) = 1.00 \ldots 0$. The unnormalized working end of the code string C(s.LPS) is the same as that to be found in the previous encoding cycle. Only a k-bit shift is required. However, if the symbol to be encoded is MPS, then the unnormalized internal variable is $T(s) - 2^{-k}$. The unnormalized code string is $C(s) + 2^{-k}$. These operations may be performed concurrently. Nevertheless, a carryover in C(s) may occur which may be handled in accordance with copending patent application Ser. No. 048,319. Notwithstanding, the realignment, if required, is only a one-bit shift.

Referring now to FIG. 1, there is shown a logic block diagram of a compression system apparatus. A binary signal source 1 provides a sequence of bits on path 3 to encoder 13. Source model 5 is a finite state machine operative upon the history of the source string to generate a control parameter k on path 9 indicative of a source alphabet probability interval, and an indication on path 7 as to whether the symbol to be encoded is either MPS or LPS. Encoder 13 alters the working end of the code string C(s) and modifies its internal variable T(s), according to whether the bit to be encoded is MPS or LPS defined by the relations for a, b, and for c, d. The output is passed to a buffer 15. This buffer retains the segment of the code string most recently generated. Further, it assembles fixed width words from C(s) and passes them to the media on output bus 17. The encoder/buffer interface can be implemented over a fixed-line parallel path. A signal on path 19 informs buffer 15 whether the symbol value encoded was MPS or LPS. If the symbol was MPS, then the buffer unit 15 determines a shift amount from the value k appearing on path 21. Consequently, buffer 15 would then accept k bits from encoder 13 over path 23. These would be bits $C[0, (k-1)]$. These bits would be shifted into the code string segment being buffered. Consequently, buffer unit 15 may output a fixed-length segment over bus 17, as well as performing a bit-stuffing operation to prevent carryover propagation as described, for example, in copending U.S. patent application Ser. No. 048,319.

If the bit operated upon by encoder 13 is LPS, as indicated over line 19, then buffer 15 would add the value of C/out 27 to the buffered code string segment. If the value appearing on path 29 relating to normalization is inactive, then renormalization is not required. In contrast, if the bit on path 29 is active, a one-bit renormalization shift is performed by shifting bit value C(0) onto the buffered code string segment. The buffer operations of outputting a fixed length or performing bit stuffing apply as if the bit that was compression encoded were MPS.

Figure 2:
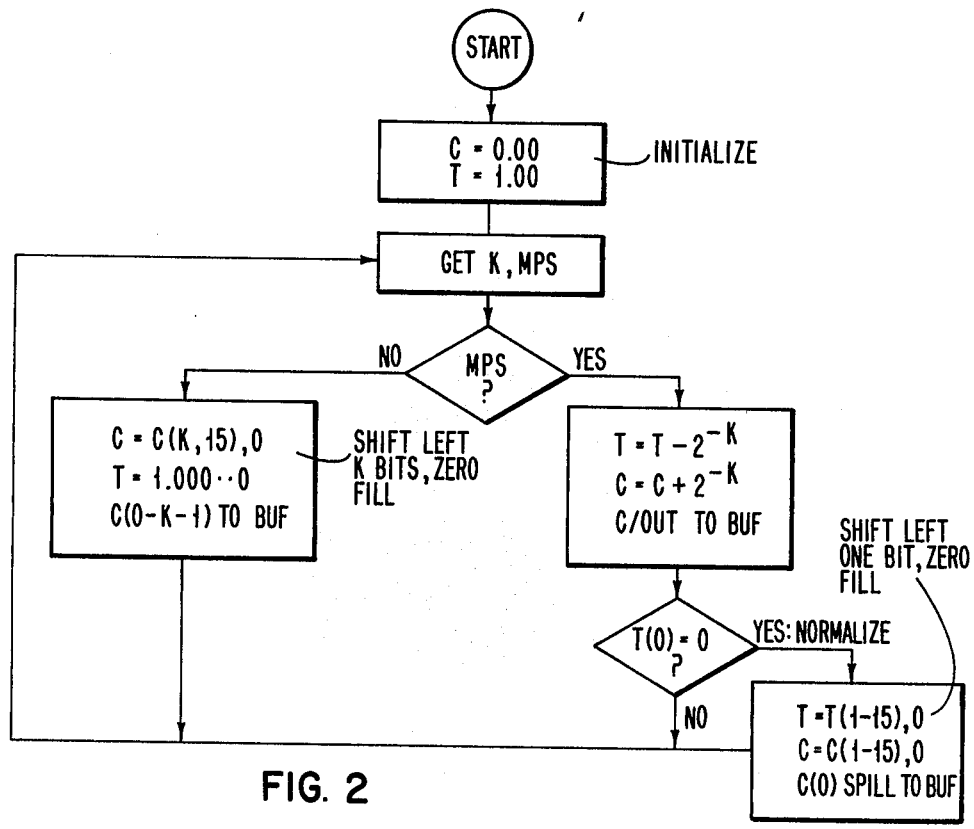
FIG. 2 is a flow diagram of the encoding algorithm.

Referring now to FIG. 2, there is shown a flow diagram of the computational aspects for executing the recursion pairs 4a, b and 4c, d. By designating a pair of shift registers, respectively C and T, for the working end (q bits) of C(s) and the internal variable T(s), the encoding actions can be understood with reference to them as the only memory in the apparatus. Initially, registers C and T are set respectively to q-bit values 0.00 ... 0 and 1.00 ... 0. During each encoding cycle, the encoder is furnished the parameter k and an indication of whether the symbol is MPS or LPS. If the symbol is LPS, then the contents of register T are set equal to 1.00 and the code string register contents C are shifted left by k bits with zeros being inserted into the right-hand bit positions thus shifted left. If the symbol is MPS, then the contents of the T register are decremented by $2^{-k}$, while the contents of the C register are incremented by $2^{-k}$, and the contents of the most significant C register position are transferred to the buffer. Next, the question is whether there exists a leading zero in the T(0) position of the T register. If not, then the encoder proceeds with the next encoding cycle. If there is a leading zero, it is necessary to renormalize T and realign the working end of the code string. This includes the steps of shifting the contents of the T and C registers, respectively, left by one bit position and inserting a zero in the least-significant bit position. The contents of the C(0), or most-significant bit position of the C register, are transferred to the buffer over path 25. After this, the next encoding cycle can be entertained.

The following examples illustrate the encoding response of the invention.

Let symbol 0 be the MPS and symbol 1 be the LPS. Let the source string consist of 5 symbols b(1), b(2), b(3), b(4), and b(5) whose values in that order are:

0, 1, 0, 0, 1.

Also, let the skew numbers for these bit positions be denoted k(1), k(2), k(3), k)4), and k(5), as follows:

2, 4, 4, 3, 2.

The arithmetic is performed to five bits of precision (q=5).

For the encoder, the model provides the value of k. From this value, the nonzero augend is formed as $2^{-k}$. If MPS, the augend is added to C to give C' and subtracted from T to give T'. Carryovers are fed to the encoder output buffer unit. If the leading bit in T' is 1, no normalization of T or realignment of C is needed. If the leading bit in T' is 0, then T is renormalized, and C' is realigned into C by a one-bit left-shift with zero fill.

Initial State: C=0.0000; T=1.0000

Note: Step (a) performs subdivision operation yielding C' without normalizing. Step (b) shows data handling part when T is normalized. The concurrent operations on C and T are brought out by placing them on the same line.

| k(1)=2, b(1)=0: Augend = .01 | |
|---|---|
| (a) C' = 0.0000+0.01 = 0.0100 | T' = 1.0000−.0100 = 0.1100 |
| (b) C = 00.1000 (realign) | T = 1.1000 |
| k(2)=4, b(2)=1: Augend = 0 | |
| (a) C' = 00.1000 (to be shifted 4) | T' = 0.0001 |
| (b) C = 001000.0000 (realign) | T = 1.0000 |
| k(3)=4, b(3)=0: Augend = .0001 | |
| (a) C' = 00 1000.0000+.0001 = 00 1000.0001 | T' = 1.0000−.0001 = 0.1111 |
| (b) C = 001 0000.0010 (realign) | T = 1.1110 |
| k(4)=3, b(4)=0: Augend = .0010 | |
| (a) C' = 001 0000.0010+.0010 = 001 0000.0100 | T' = 1.1110−.0010 = 1.1100 |
| (b) C = 001 0000.0100 (no realignment needed) | T = 1.1100 |
| k(5)=2, b(5)=1: Augend = 0 | |
| (a) C' = 001 0000.0100+0 | T' = 0.0100 |
| (b) C = 0 0100 0001.0000 (realign by shift left 2) | T = 1.0000 |

Let the decoder receive string 0010000010000#, where # serves as an end-of-string marker.

Figure 3:
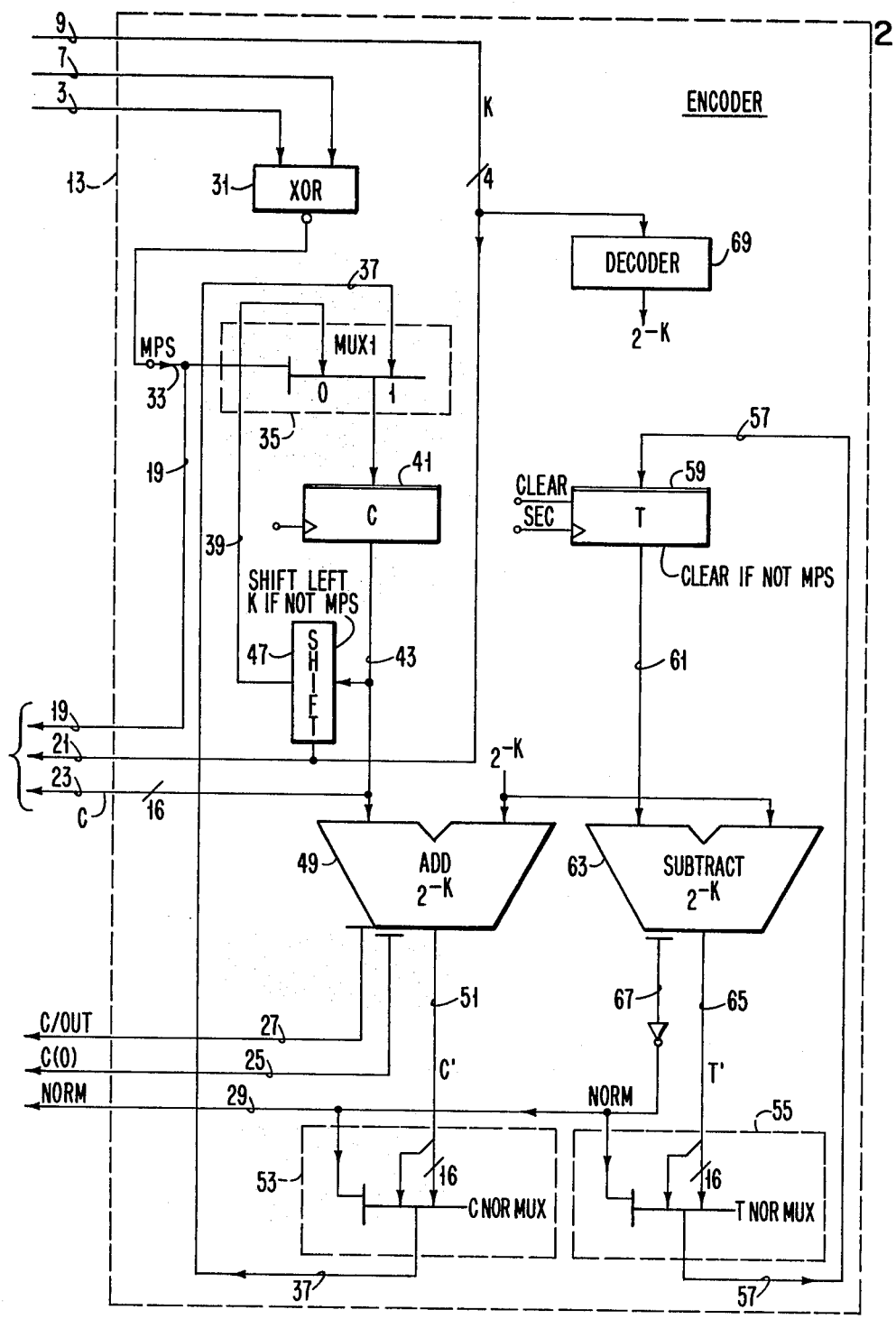
FIG. 3 is a two-ALU loop encoding apparatus for practicing the method of the invention.

Referring now to FIG. 3, it should be appreciated that the encoder block diagram has as its objective the independent and concurrent computation of new values for the code stream C(s) and internal variable T(s) and the realignment of the working end of the code string in respect of these new values. To accomplish this, the encoder embodiment uses a pair of computation loops. A first loop includes shift register C 41, adder 49, multiplexer 53, and path 37. A second loop includes shift register T 59, subtracter 63, multiplexer 55, and path 57. Thus, the only memory elements in the encoder are the registers C 41 and T 59. These registers are constructed from edge-triggered D-type flip-flops which are clocked at the end of a recursion cycle. The time duration between successive active transitions of the clock exceeds the worst-case combinational circuit delays in the loop feeding each register. In the case of register T 59, there is a "clear" input responsive to a level-sensitive signal in contrast to an edge-triggered signal. An active level on the "clear" input line takes precedence over the edge-triggered input, as is the case with most D-type flip-flops.

Exclusive OR-gate XOR 31 terminates the MPS/LPS indication from source model 5 over path 7 and the binary symbol value of zero or one from the symbol source 1 over path 3. The output from gate 31 constitutes the characterization of the symbol to be encoded as either MPS or LPS. This is achieved by way of adder 49 combining the contents of register C over path 43 and the operand $2^{-k}$ on the other adder input. The contents of register C constitute the q-least-significant bits (working end) of the code string C(s). The resulting sum of this addition may generate an active carry-out signal over output path 27 to the buffer. On an encoding of an MPS cycle, a one-bit renormalization shift may be required. This occurs when the most-significant bit position in register T is zero. Then, a signal over path 29 appropriately selects the outputs through multiplexers 53 and 55, as well as being pathed to the buffer over path 29. In this regard, the realignment of the working end of C(s) is the function of multiplexer 53, and the most significant bit of register C, i.e., C(0), appears on path 25 to the buffer. The left input of multiplexer 53 is formed from the left-shifted output, while the right input is the unchanged output of adder 49 over path 51. Multiplexer 53 has an output bus 37 which is fed to the right input of multiplexer 35. Here the output is passed to the data input of the C register. It is loaded into said register at the end of a clock cycle.

If the signal on path 33 is LPS, then the contents of register C are left-shifted under control of shifting network 47 operative over path 39 into multiplexer 35. The shift magnitude is governed by the control parameter k applied thereto over four-bit-wide path 9 from source model 5. In addition to regulating the shift network 47, parameter k is also supplied to the buffer over path 21. Concurrent with the LPS indication on path 33, a clear signal is applied to register T 59. This sets the most significant bit position to 1. It is the case, that what is moved to the buffer from register C 41 are the k-most-significant bits therein, i.e., from position C(0) to C(K−1). This means that the value of C(s) is unchanged, but the working end of the code string is realigned to the left-shift of k bits. Shifter 47 is of the barrel shifter type with a zero fill performing this operation. The shifter output 39 is fed to the C register via the right input of data selector and multiplexer 35. The right input is selected when the control signal is active indicative of an LPS. This passes the shifter output to the register C input, where it is loaded into the C register at the end of the cycle. On this cycle, the buffer 15 must accept the k-leading bits of the C register. Path 23 conveys all bits of C to the buffer 15. The buffer must select the correct amount under control of the value k applied to it over path 21.

If the signal upon path 33 is MPS, then the unnormalized value of T is calculated by applying the contents of the register as one operand input to subtracter 63 over path 61 with the other operand input being $2^{31\ k}$, derived from decoder 69. The unnormalized difference appears on path 65. The leading bit of the difference obtained from subtracter 63 is tested to ascertain if it is a leading zero. If said most-significant bit is a leading zero, then a left-shift of one bit position is executed at the left input of multiplexer 55. In the absence of a leading zero, the subtracter output over path 65 is passed without change through the multiplexer 55 and returned to the T register. It is clocked into the T register at the end of the cycle.

It is well recognized that decoding is the dual of encoding. As previously mentioned, decoding is done by examining the most significant part of a code string and determining from its magnitude the largest augend which does not exceed the value of the code string. This augend is subtracted out, and the decoded symbol is that which corresponds to that augend. The two pieces of information which the decoder must receive, in addition to the most significant part of the code stream C(s), are the control parameter k and the MPS value. It should, with this information, decode the symbol which has previously been encoded at that point. According to the principles of this invention, such a result may be achieved through a simple modification of the encoder apparatus depicted in FIG. 3 and herein below described.

In what follows, assume the MPS value is 0. It is not known which symbol b(i) was encoded, but there is known the coding parameter k(i), so that a nonzero augend can be formed. To determine b(i), form trial augend $2^{-k}$ and subtract it from C to form trial result R. There is simultaneously subtracted the trial augend from T to form T'. If trial result R is negative, b(i)=LPS, or 1 in our example. Otherwise, b(i)=MPS, which is 0 in our example, and R is the unrealigned new value for C. Adjust recursion variable T in accordance with the result. In the following, step (a) shows the trial subtraction resulting in R (trial value of C). In step (b) the symbol is decoded. In step (c), T is adjusted accordingly and T and C are realigned.

```
Initial State:
C = 0.0100 0001 0000#           T = 1.0000
k(1)=2: Trial Augend = .01
(a) R=0.0100 001 000−.01
   =0.0000 0001 0000            T' = 1.0000−.01=.1100
(b) R≧0: b(1)=0. Keep results, normalize and realign.
(c) C = 00.0000 0010 000#       T = 1.1000
K(2)=4: Trial Augend = .0001
(a) R=00.0000 0010 000−.0001
   =NEGATIVE                    T' = 1.0111
(b) R<0: b(2)=1. Shift C left by k=4 bits,
                                Reset T to 1.
(c) C = 0.0010 000#              T = 1.0000
k(3)=4: Trial Augend = .0001
(a) R=0.000100 000#−.0001
   =0.0001 000                  T' = 1.0000−.0001=0.1111
(b) R≧0: b(3)=0. Keep trial results. Normalize and realign.
(c) R=0.0010 00#                 T = 1.1110
k(4)=3: Trial Augend = .0010
(a) R=0.0010 00#−.0010
   =0.0000 00#                  T' = 1.1110−.0010=1.1100
(b) R≧0: b(4)=0. Keep trial results. No renormalization.
```

```
-continued
(c) C = 0.0000 00#               T = 1.1100
K(5)=2: Trial Augend = .0100
(a) R=0.0000 00#−.0100
   =NEGATIVE                    T' = 1.1100−0100=1.1000
(b) R<0: b(5)=1. Shift C left by k=2 bits,
                                Reset T to 1.
(c) C = 0.0000#                  T = 1.0000
```

End of code string has reached 5 significant bits of C; and C is zero. Decoding process is over.

The decoder is implemented the same as the encoder. This includes a source model to which successive decoded symbols b(i) are applied to obtain k(i). There are several additions. First, the capability to subtract $2^{-k}$ from C is needed. Second, the carryout value becomes a control input which indicates the b(i)=0 or b(i)=1 for the decoding cycle. Third, in the encoder, the normalization left shifts and LPS left shifts of C are with "zero fill". In the decoder, these shifts to C receive the "fill" bits from the next leading bits in the decoder input buffer.

Although the invention has been described with reference to a preferred embodiment thereof, it will be understood by those skilled in the art that various changes in the method and apparatus may be made without departing from the spirit or scope of the invention.

We claim:

1. A machine-implementable method for recursively generating an arithmetically compressed binary number steam C(s.b) in high-to-low position magnitude order responsive to successive symbols b(i) from a binary symbol string s=b(1), b(2), . . . b(i), . . . , b(n), in a reduced number of operations per encoding cycle, comprising the steps of:

writing the q-least-significant bits of C(s) and an internal variable T(s) into respective first and second shift registers; and ascertaining for each b(i) whether it constitutes a most-probable symbol (MPS); and deriving an integer k as a coding parameter indicative of an expectation for the least-probable symbol (LPS); characterized in that the method comprises the further steps of:

concurrently incrementing the first register contents and decrementing the second register contents by $2^{-k}$ and left-shift normalizing both register contents if the second register contains a leading zero, if b(i) is an MPS; and left-shifting the first register contents by k positions and setting the second register contents to unity, if b(i) is an LPS.

2. An encoding apparatus for recursively altering a compressed bit stream representation of a string of binary symbols in a reduced number of operations per symbol encoding cycle comprising:

a first (41) and second (59) shift register containing the q-least-significant bits of the compressed stream C(s) and an internal variable T(s); means (31, 33) for characterizing each received symbol as either a most-probable symbol (MPS) or a least-probable symbol (LPS); characterized in that the apparatus further comprises:

means (9, 35, 39, 47) responsive to an LPS symbol characterization and to a parameter k whose values correspond to a predetermined source alphabet probability interval for shifting out the k-most-significant bits in the first register and zero-filling the k-least-significant bit positions therein, said means further including means for setting the second register contents to unity; and means (49, 63, 53, 55) for concurrently incrementing the first register contents by $2^{-k}$ and decrementing the second register contents by $2^{-k}$, left-shift normalizing (67, 53, 55) both register contents if the second register contains a leading zero in response to an MPS symbol characterization and the parameter k.

3. An encoder for recursively generating an arithmetically compressed binary number stream C(sb) in high-to-low position magnitude order responsive to a binary character string, each character being identified as either a most-probable symbol (MPS) or a least-probable symbol (LPS) and having associated therewith a parameter k whose value corresponds to a predetermined source alphabet probability interval, comprising:

a first- (41) and second- (59) shift register containing the q-least-significant bits of the compressed stream and an internal variable; characterized in that the encoder further comprises:

means (9, 47, 39, 35) responsive to each ordered pair MPS, k for shifting out the k-most-significant bits and zero-filling the k-least-significant bits of the first register and setting (CLEAR) the second register contents to unity; and a first and second computation loop (49, 51, 53, 37; 63, 65, 55, 57) for additively combining $2^{-k}$ to the first register contents and subtractively combining $2^{-k}$ from the second register contents, said first and second loop including means (67, 53, 55) for left-shift normalizing both register contents if the second register contains a leading zero responsive to each ordered pair of LPS, k.

4. A machine-implementable method for recursively generating successive symbols b(i) of a binary symbol string s=b(1), b(2), ... b(i), ... , b(n) responsive to successive high-to-low position magnitude order bits of an arithmetically compressed binary number stream C(s.b) using a reduced number of operations per decoding cycle, comprising the steps of:

writing the q-most significant bits of C(s.b) and an internal variable T(s) into respective first and second shift registers;

deriving an integer k(i) as a coding parameter indicative of an expectation that the decodable symbol is a least-probable symbol (LPS); characterized in that the method comprises the further steps of:

concurrently decrementing the first and second register contents by $2^{-k(i)}$;

testing the most-significant bit position of the first register;

left-shift normalizing both register contents if the tested bit position is 1 and decoding the symbol as a most-probable symbol; and left-shifting the first register contents by k positions and setting the second register contents to unity if the tested bit position is a 0, and decoding the symbol as an LPS.

* * * * *